(12) United States Patent
Bien et al.

(10) Patent No.: US 11,515,878 B1
(45) Date of Patent: Nov. 29, 2022

(54) FAST RESPONSE LEVEL SHIFTER FOR CLAMP GATE CONTROL

(71) Applicant: NXP USA, Inc., Austin, TX (US)

(72) Inventors: David Edward Bien, Glendale, AZ (US); Siamak Delshadpour, Phoenix, AZ (US); Ranjeet Kumar Gupta, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/400,799

(22) Filed: Aug. 12, 2021

(51) Int. Cl.
    *H03K 19/0185* (2006.01)
(52) U.S. Cl.
    CPC ............... *H03K 19/018528* (2013.01)
(58) Field of Classification Search
    None
    See application file for complete search history.

(56) References Cited

U.S. PATENT DOCUMENTS

| | | | |
|---|---|---|---|
| 8,638,078 B2 | 1/2014 | Kudo et al. | |
| 8,982,746 B2 * | 3/2015 | Chen | G06F 13/4027 370/293 |
| 9,571,075 B1 | 2/2017 | Ng | |
| 11,245,555 B1 * | 2/2022 | Delshadpour | H04L 25/03949 |
| 2020/0136382 A1 | 4/2020 | Delshadpour et al. | |

OTHER PUBLICATIONS

Lin, Zhihong, Texas Instruments; "Understanding the embedded USB2 (eUSB2) standard"; retrieved from the Internet https://e2e.ti.com/blogs_b/analogwire/posts/understanding-embedded-usb2-eusb2; 3 pages (Aug. 19, 2019).

"Embedded USB2 (eUSB2) Physical Layer Supplement to the USB Revision 2.0 Specification—Revision 1.1" retrieved from the Internet https://www.usb.org/sites/default/files/eUSB2_1p1_20180917.pdf; 158 pages (2018).

* cited by examiner

Primary Examiner — Jeffery S Zweizig

(57) ABSTRACT

Various embodiments relate to a level shifter circuit configured to generate a voltage output, including: a first charging path circuit; a second charging path circuit; and an enable circuit configured to enable the first charging path circuit and the second charging path circuit, wherein
    the voltage output is a combination of the voltage from the first charging path circuit and the second charging path circuit, the first charging path circuit charges up to a voltage limit, and the first charging path circuit charges the voltage output faster than the second charging path circuit.

18 Claims, 2 Drawing Sheets

FAST RESPONSE LEVEL SHIFTER FOR CLAMP GATE CONTROL

TECHNICAL FIELD

Various exemplary embodiments disclosed herein relate generally to systems and methods for a fast response level shifter for clamp gate control.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a level shifter circuit configured to generate a voltage output, including: a first charging path circuit; a second charging path circuit; and an enable circuit configured to enable the first charging path circuit and the second charging path circuit, wherein the voltage output is a combination of the voltage from the first charging path circuit and the second charging path circuit, the first charging path circuit charges up to a voltage limit, and the first charging path circuit charges the voltage output faster than the second charging path circuit.

Various embodiments are described, wherein the first charging path circuit further includes a first PMOS transistor in series with a second PMOS transistor, wherein the gate of the first PMOS transistor is connected to the enable circuit and the gate of the second PMOS transistor is connected to the voltage output.

Various embodiments are described, wherein the first charging path circuit further includes a third PMOS transistor connected between a first voltage source and the first PMOS transistor, wherein the third PMOS transistor has a gate connected to a first control circuit.

Various embodiments are described, further including an NMOS transistor connected between the voltage output and ground with a gate connected to the enable circuit.

Various embodiments are described, wherein the second charging path circuit further includes a fourth PMOS transistor connected between a second voltage source and a first resistor, wherein the gate of the fourth PMOS transistor is connected to the enable circuit.

Various embodiments are described, further including an PMOS transistor connected between the voltage output and ground with a gate connected to a first power source through a second resistor.

Various embodiments are described, the enable circuit includes an inverter configured to receive an enable signal and to output an inverted enable signal.

Further various embodiments relate to a high-speed data path circuit with first and second differential inputs, including: an equalizer with first and second equalizer inputs; a gain circuit; a transmit line driver; an offset cancellation controller configured to compensate for offset in the equalizer; a first transistor clamp connected between the first differential input and the first equalizer input controlled by a gate voltage VG; a second transistor clamp connected between the second differential input and the second equalizer input controlled by a gate voltage VG; a first switch configured to connect the first equalizer input to a common mode voltage VCM; a second switch configured to connect the second equalizer input to VCM; level shifter circuit configured to generate VG at a voltage output, including a first charging path circuit; a second charging path circuit; and an enable circuit configured to enable the first charging path circuit and the second charging path circuit, wherein the voltage is a combination of the voltage from the first charging path circuit and the second charging path circuit, the first charging path circuit charges up to a voltage limit, and first charging path circuit charges the voltage output faster than the second charging path circuit.

Various embodiments are described, wherein the first charging path circuit further includes a first PMOS transistor in series with a second PMOS transistor, wherein the gate of the first PMOS transistor is connected to the enable circuit and the gate of the second PMOS transistor is connected to the voltage output.

Various embodiments are described, wherein the first charging path circuit further includes a third PMOS transistor connected between a first voltage source and the first PMOS transistor, wherein the third PMOS transistor has a gate connected to a first control circuit.

Various embodiments are described, further including an NMOS transistor connected between the voltage output and ground with a gate connected to the enable circuit.

Various embodiments are described, wherein the first charging path circuit further includes a fourth PMOS transistor connected between a second voltage source and a first resistor, wherein the gate of the fourth PMOS transistor is connected to the enable circuit.

Various embodiments are described, further including an PMOS transistor connected between the voltage output and ground with a gate connected to a first power source through a second resistor.

Various embodiments are described, the enable circuit includes an inverter configured to receive an enable signal and to output an inverted enable signal.

Various embodiments are described, wherein the offset cancellation controller is configured to measure the offset of the equalizer and to produce a trim code input into the equalizer to compensate for the offset of the equalizer.

Various embodiments are described, wherein the offset cancellation controller measures the offset of the equalizer at an output of the gain circuit.

Various embodiments are described, wherein the offset cancellation controller measures the offset of the equalizer at an output of the transmit line driver.

Various embodiments are described, wherein an enable signal produced by the enable circuit initiates the operation of the offset cancellation controller, controls the level shifter to generate VG, and controls the first switch and the second switch to connect the first equalizer input and the second equalizer input to VCM.

BRIEF DESCRIPTION OF THE DRAWINGS

In order to better understand various exemplary embodiments, reference is made to the accompanying drawings, wherein.

DETAILED DESCRIPTION

Figure 1:
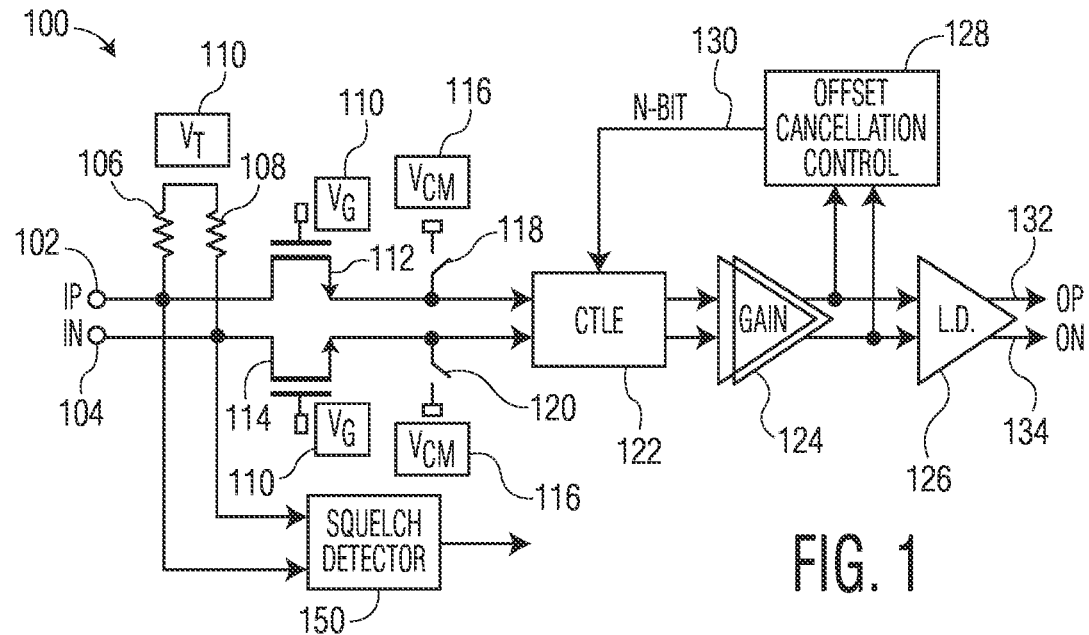
FIG. 1 illustrates the high-speed path of a USB2 to eUSB2 repeater with high voltage protection at the input in form of NMOS clamp.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

The embedded USB2 (eUSB2) specification is a supplement to the USB2.0 specification that addresses issues related to interface controller integration with advanced system-on-chip (SoC) process nodes by enabling USB2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks.

As applications like smartphones and tablets continue to pack more and more components into smaller form factors, it is essential that interfaces shrink as well. However, the continued shrinking of SoC node size has led to a thinner gate oxide that can only support lower voltages. For devices relying on USB2.0 interfaces, this trend can lead to complicated design challenges for advanced process nodes.

When process nodes reach 7 nm, quantum effects begin impacting high-signaling-voltage inputs/outputs (IOs) such as 3.3V and can no longer be easily supported. Many device-to-device interfaces already support low signaling voltages, but USB2.0 still requires a 3.3V I/O voltage to operate.

USB2.0 has been the most successful wired interface in the past 20 years, and almost all SoCs today are equipped with the USB2.0 interface. USB standards evolution kept the original 3.3V I/O USB 1.0 interface intact for backward compatibility, helping enable wider adoption and a larger ecosystem while also preserving device interoperability.

As process nodes approach smaller features (e.g., 5 nm), the manufacturing cost to maintain USB2.0 3.3V I/O signaling has grown exponentially. eUSB2 addresses the I/O voltage gap as a physical layer supplement to the USB2.0 specification so that designers can integrate the eUSB2 interface at the device level while leveraging and reusing the USB2.0 interface at the system level.

eUSB2 can support onboard inter-device connectivity through direct connections as well as exposed connector interfaces through an eUSB2-to-USB2.0 repeater, to perform level shifting While USB2.0 can continue to be integrated into SoCs with process features of 7 nm and above, eUSB2 is a good fit for SoCs when process features are 5 nm and below. eUSB2 can also be integrated into other devices to easily interconnect with SoCs as a device-to-device interface. USB2.0 will continue serving as the standard connector interface.

eUSB2 allows significant I/O power reduction and improves power efficiency, while enabling process features to continue to scale.

A USB2 to eUSB2 repeater includes a USB2 port and an eUSB2 port. Bidirectional traffic may be carried by the repeater include low speed (LS), full speed (FS), and high speed (HS) traffic. The repeater may have different voltage domains that serve the different ports. For example, a 1.8V source may be used to power the circuits related to the eUSB2 port, and a 3.3V source may be used to power the circuits related to the USB2 port. Each of the USB2 pins faces ~3.6V voltage in LS/FS mode and <1.1V signal in HS mode (0.44V in functional mode and <1.1V in chirp mode), so it is assumed that the maximum signal in each of the USB2 pins during the HS-RX mode will be 1.1V.

An embodiment will be described that offers a system and circuit level solution for a USB2/eUSB repeater to use low voltage device on high-voltage USB2 pins with a gate control scheme of NMOS clamp for fast turn on time. This enables an on-the-fly offset trimming feature and a fast return back to service after trimming for the USB2/eUSB repeater signal path. Fast turning on of the high-speed channel is essential to meet USB2 timing budget during the port reset (where on-the-fly offset trimming procedure is performed before entering into HS mode). The technique implemented in the embodiments described herein may be used for a fast start up clamp circuit with low complexity. It facilitates using a low-voltage device connected to a high-voltage pin and facilitates a fast reaction to re-enable operation after trimming. Use of low-voltage devices in the signal path are essential to the high-speed jitter performance.

FIG. 1 illustrates the high-speed path of a USB2 to eUSB repeater with high voltage protection at the input in form of NMOS clamp. The high speed path 100 includes USB2 input pins 102, 104 that receive a differential input signal. Each input pin 102, 104 may have a termination resistance 106, 108 respectively terminated to a voltage VT. The incoming USB2 signal passes through an equalizer 122 that may be a continuous time linear equalizer (CTLE). The output of the equalizer 122 then passes through gain stages 124 to amplify the signal. Then a transmit (TX) driver 126 then transmits the eUSB signal to eUSB pins 132, 134.

The equalizer 122 may have an offset. Any offset, even a small one, in the output of the equalizer 122 is then amplified so that the amplified offset now can create a large offset at the input to the TX driver 126 which will degrade jitter performance of the high-speed path 100 which has a tight budget for an USB2/eUSB repeater (also in a eUSB2/USB2 repeater). This means that offset of chain from the equalizer 122 and the gain stages 124 needs to be canceled. Note, any extra stage like delay cells to shape de-emphasis and a TX driver buffer which are not shown should be considered in the offset cancellation. This means that the best point for offset cancellation will be before TX driver 126, but it may also be done after the TX driver 126.

One solution may include automatic test equipment (ATE) trimming of the offset. This usually is done at nominal condition. Due to different ambient temperature and junction temperatures in functional modes, the die temperature will vary. It causes shift in offset which will degrade jitter performance of the repeater.

This means that an on-the-fly trimming is needed. This may happen any time before using the USB2 to eUSB high-speed path 100 for the transmission of data. To run the on-the-fly offset trimming procedure, the input pins of the equalizer 122 will be shorted and an offset cancellation controller 128 will measure the offset found after the gain stages 124. The offset cancellation controller 128 will then produce a trimming code 130 based upon the measured offset. The trimming code 130 will be applied to the equalizer 122 that will then compensate of the measured offset, and the process repeated until the offset is approximately zero or within a threshold value of zero.

The USB2 pin signals may be up to 3.6V in a functional mode. This means that input devices of the equalizer 122 will have to tolerate this higher voltage while its functional voltage is less than 1.1V and that the higher voltage may be handled by low-voltage devices which provide high speed performance. The offset cancellation controller 128 takes the differential signal before the TX driver 126 and generates the trimming code after applying an algorithm to determine the code associated with the measured offset. Alternatively, the offset cancellation controller 128 may also be connected after the TX driver 126 at the output pins 132, 134.

Transistor clamps 112, 114 are connected in series between USB2 input pins 102, 104, respectively and equalizer 122. The transistor clamps 112, 114 will protect the equalizer input. Sources of the transistor clamps 112, 114 may be clamped one $V_{threshold}$ below its gate voltage using a voltage $V_G$ 110.

The absolute maximum voltage of the low-power devices in the used technology is 2.4V (this can be different in other process nodes). Because a chip implementing the high-speed path 100 has two sources including 1.8V and 3.3V sources (i.e., 1.62V to 1.98V and 3.0V to 3.6V), using a 1.8V supply for $V_G$ may clamp the input voltage to the equalizer 122 to a lower than required level which may inhibit the functionality of the high-speed path 100. Also using a 3.3V supply which has a maximum voltage of 3.6V will clamp it to a higher voltage which may damage the low-voltage devices at the input of the equalizer 122.

The best performance requires biasing the transistor clamps 112, 114 at the highest possible voltage in order to minimize the clamp rise on-time $R_{on}$ during operation while maintaining a safe voltage level at the input devices of the equalizer 122. Biasing the transistor clamp voltage at 3.3-3.6V is too high, however biasing at 1.62-1.98V is too low. A level shifter that shifts down the 3.3V voltage to about 2.4V (which is about one $V_{GS}$ above the 1.8V supply) will do the job. A level shifter with the right enable/disable scheme may be used to control $V_G$ of the transistor clamps 112, 114 which will be about 2.4V during a functional mode or 0V during an offset trimming mode.

During the on-the-fly offset trimming, gates of transistor clamps 112, 114 will be shorted to ground to keep them off and isolate USB2 pins from the input of the equalizer 122, i.e., $V_G$=0V. The high-speed path 100 also includes two switches 118, 120 connected between a voltage $V_{CM}$ and the inputs to the equalizer 122. Switches 118, 120 are open during the normal operation mode When the switches are closed during the trimming mode, the equalizer inputs will be connected together to $V_{CM}$. The value of $V_{CM}$ is the common mode voltage of the incoming signal to the equalizer 122. $V_{CM}$ is a fixed voltage (e.g., ground) while $V_G$ is generated by the level shifter. When the offset calibration is completed, transistor clamps 112, 114 need to be enabled fast so as to quickly restore normal operation.

Figure 2:
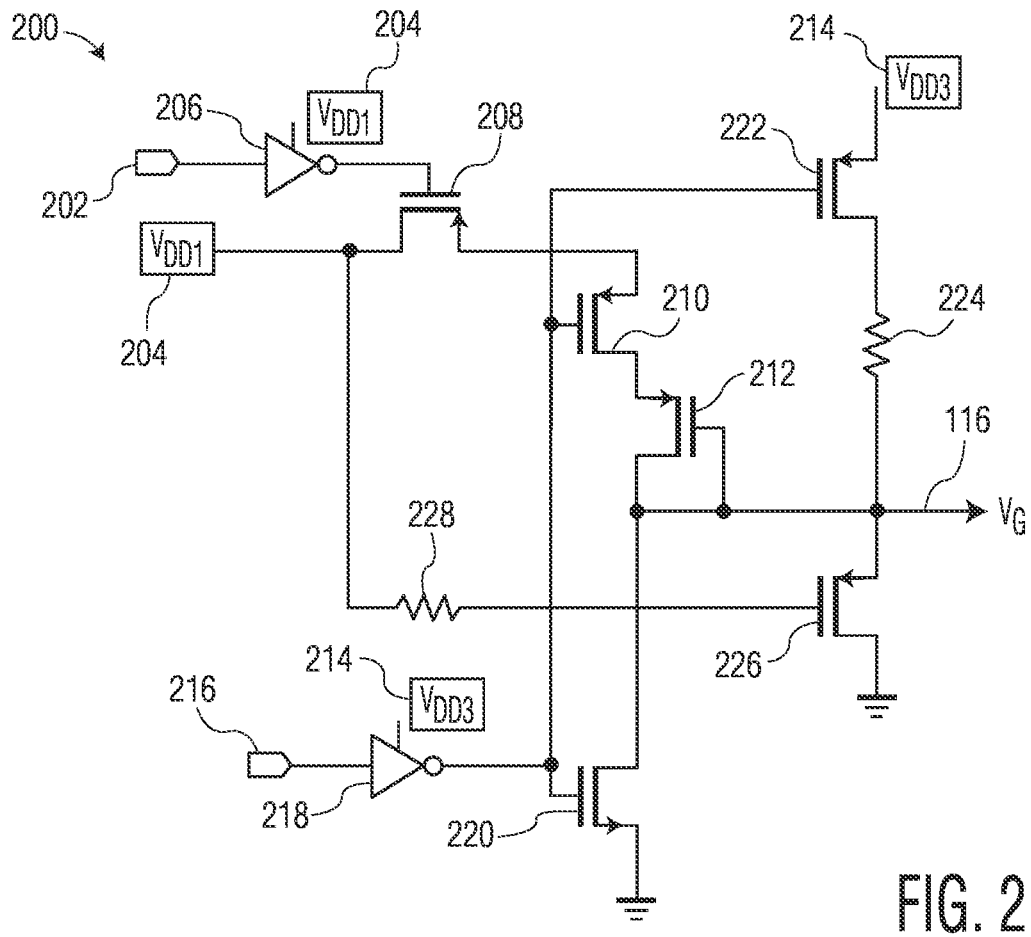
FIG. 2 illustrates an embodiment of a level shifter that controls gate of the transistor clamps.

FIG. 2 illustrates an embodiment of a level shifter that controls gate of the transistor clamps. The level shifter includes pad 202, PMOS transistors 208, 210 212, 222, NMOS transistor 220, resistors 228 and R224, inverters 206, 218, voltage sources $V_{DD1}$ 204 and $V_{DD3}$ 214, enable pad 216, and voltage $V_G$ 116. The pad 202 is connected to the inverter 206 powered by $V_{DD1}$ 204. The pad 202 is connected to a voltage Poda_3v3 which indicates that the $V_{DD3}$ power source is available. $M_S$ 208 has its gate connected to the output of invertor 206, its drain connected to $V_{DD1}$ 204, and its source connected transistor 210. Transistor 210 has its gate connected to the output of inverter 218 and its drain connected to the source of transistor 212. Transistor 212 has its gate connected to $V_G$ 116 and its drain connected to the drain of $M_{N1}$ 220 and $V_G$ 116. $M_{N1}$ 220 has its gate connected to the output of the inverter 218 and its source connected to ground.

The inverter 218 receives an enable signal En from the enable pad 216 and is powered by $V_{DD3}$. Transistor 222 has its gated connected to the output of the inverter 218, it source connected to $V_{DD3}$ 214, and its drain connected to resistor 224. The resistor 224 is connected between transistor 222 and $V_G$ 116. Transistor 226 has its gate connected $V_{DD1}$ through resistor 228, its source connected to $V_G$ 116, and its drain connected to ground.

The operation of the level shifter 200 will now be described. The En signal, which is in the 3.3V domain, will control the level shifter. When En=low=0V, Transistor 220 will pull 116 to ground so that $V_G$=0V. When En=high=3.3V, $M_{N1}$ 220 is off and transistor 222 is ON. This results in a current flow from $V_{DD3}$ 314 through resistor 224. transistor 226 will be ON, and because its gate is connected to $V_{DD1}$ 204 (resistor 228 has been added to provide the secondary ESD protection), its source will be one $V_{threshold}$ higher than its gate, 1.8V+0.6V=2.4V. This level shifter brings the $V_G$ to desired voltage level of ~2.4V as needed for the reliable operation of the clamp 110, 112. Resistor 224 is used to limit the current flowing through level shifter in the enable state of the level shifter.

When going from "disable" to "enable" mode, transistor 210 and transistor 212 form an auxiliary charging path circuit (the body of transistor 212 is connected to its source) that will be "ON" to provide a path from $V_{DD1}$ (as transistor 208 is ON in the power supply available mode) to allow for a fast power on time for the level shifter. This auxiliary path of transistor 210 and transistor 212 charges up the $V_G$ node 116 quickly to about 1.8V-$V_{threshold}$, and the rest of charge will come from transistor 222 and the resistor 224 that form a primary charging path. When $V_G$ 116 becomes more than 1.8V, transistor 212 will be OFF and the transitory current passing through transistor 210 and transistor 212 has completed its function to help quickly charge $V_G$ 116.

$M_S$ 208 is added to avoid any leakage when the $V_{DD3}$ 214 supply is not available (i.e., $V_{DD3}$ 0V) and the $V_{DD1}$ 204 supply is available (i.e., $V_{DD1}$=1.8V). $M_S$ 208 will be off in this mode, and $V_G$ 116 will stay at 0V. This guarantees that the transistor clamps are OFF and there will no path for the current from $V_{DD1}$ to $V_{DD3}$ supply. When $V_{DD3}$ supply is not present, the gate voltage of the transistor 210 and transistor 222 are floating and there is a possibility of current flowing from $V_{DD1}$ to $V_{DD3}$ via transistor 210, transistor 212, resistor 224, and transistor 222 devices. Addition of transistor 208 helps disabling the current path from $V_{DD1}$ to $V_{DD3}$ when $V_{DD3}$ is not present. This provides a safe condition so that the back current to the supply stays zero.

Resistor 224 will limit the consumed current from the $V_{DD3}$ 214 supply in the functional mode to [$V_{DD3}$-($V_{DD1}$-Vthreshold)]/R. A tradeoff between value of R 224 which defines enable time of the transistor clamps versus consumed current in the level shifter 100 may be carried out in order to select a desired value of R 224.

The level shifter 200 provides low complexity and good efficiency which supports the requirements of the offset trimming of the high-speed path 100. This results in better performance of the USB2/eUSB2 repeater without adding complexity or cost while improving the performance of the high-speed data path 100.

Figure 3:
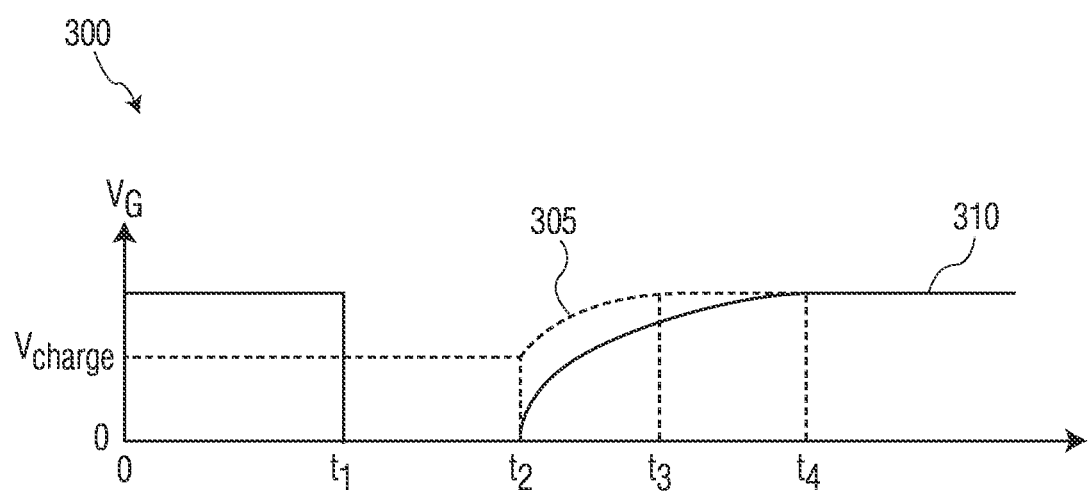
FIG. 3 illustrates a plot of the voltage $V_G$.

FIG. 3 illustrates the rise time of $V_G$ with and without the fast charging path of the level shifter. FIG. 3 illustrates a plot of the voltage $V_G$. At time $t_1$ the trimming operation is enabled, and the En signal 216 is set to 0. Accordingly, $V_G$ is set to 0V so that the transistor clamps 112, 114 are turned off, and the switches 118, 120 connect the voltage $V_CM$ 116 to the inputs of the equalizer 112. Then the offset trimming operation is carried out by the offset cancellation controller 128. Also at time $t_2$, the enable signal En 216 is on (note that enable is not set high until $t_2$ when trimming has completed) causing the level shifter to start charging $V_G$ 116. Once the trimming operation is finished at time $t_3$ the voltage at $V_G$ has a voltage of $V_{charge}$ As a result the voltage at $V_G$ 305 begins charging at $t_2$ returns to the desired value at time $t_3$. Without the fast charging function of the level shifter 100, the voltage at $V_G$ 310 returns to the desired value at time $t_4$ which is greater than time $t_3$. As a result, the level shifter 200 helps the transistor clamps 112, 114 to turn on more quickly allowing normal operation to resume more quickly after the trimming operation.

The embodiments described herein may be used for any kind of situation where a gate voltage of a transistor needs to be driven to a desired value quickly and without complex circuitry.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A level shifter circuit configured to generate a voltage output, comprising:
    a first charging path circuit;
    a second charging path circuit; and
    an enable circuit configured to enable the first charging path circuit and the second charging path circuit,
    wherein
        the voltage output is a combination of voltage from the first charging path circuit and the second charging path circuit,
        the first charging path circuit charges up to a voltage limit, and
        the first charging path circuit charges the voltage output faster than the second charging path circuit.

2. The level shifter circuit of claim 1, wherein the first charging path circuit further comprises a first PMOS transistor in series with a second PMOS transistor, wherein a first gate of the first PMOS transistor is connected to the enable circuit and a second gate of the second PMOS transistor is connected to the voltage output.

3. The level shifter circuit of claim 2, wherein the first charging path circuit further comprises a third PMOS transistor connected between a first voltage source and the first PMOS transistor, wherein the third PMOS transistor has a third gate connected to a first control circuit.

4. The level shifter circuit of claim 3, further comprising an NMOS transistor connected between the voltage output and ground with a fourth gate connected to the enable circuit.

5. The level shifter circuit of claim 1, wherein the second charging path circuit further comprises a fourth PMOS transistor connected between a second voltage source and a first resistor, wherein a first gate of the fourth PMOS transistor is connected to the enable circuit.

6. The level shifter circuit of claim 5, further comprising an PMOS transistor connected between the voltage output and ground with a second gate connected to a first power source through a second resistor.

7. The level shifter circuit of claim 1, the enable circuit includes an inverter configured to receive an enable signal and to output an inverted enable signal.

8. A high-speed data path circuit with first and second differential inputs, comprising:
    an equalizer with first and second equalizer inputs;
    a gain circuit;
    a transmit line driver;
    an offset cancellation controller configured to compensate for offset in the equalizer;
    a first transistor clamp connected between the first differential input and the first equalizer input controlled by a gate voltage $V_G$;
    a second transistor clamp connected between the second differential input and the second equalizer input controlled by the gate voltage $V_G$;
    a first switch configured to connect the first equalizer input to a common mode voltage $V_{CM}$;
    a second switch configured to connect the second equalizer input to $V_{CM}$;
    level shifter circuit configured to generate $V_G$ at a voltage output, comprising
        a first charging path circuit;
        a second charging path circuit; and
        an enable circuit configured to enable the first charging path circuit and the second charging path circuit,
        wherein
            the voltage output is a combination of voltage from the first charging path circuit and the second charging path circuit,
            the first charging path circuit charges up to a voltage limit, and
            first charging path circuit charges the voltage output faster than the second charging path circuit.

9. The high-speed data path circuit of claim 8, wherein the first charging path circuit further comprises a first PMOS transistor in series with a second PMOS transistor, wherein a first gate of the first PMOS transistor is connected to the enable circuit and a second gate of the second PMOS transistor is connected to the voltage output.

10. The high-speed data path circuit of claim 9, wherein the first charging path circuit further comprises a third PMOS transistor connected between a first voltage source and the first PMOS transistor, wherein the third PMOS transistor has a third gate connected to a first control circuit.

11. The high-speed data path circuit of claim 10, further comprising an NMOS transistor connected between the voltage output and ground with a fourth gate connected to the enable circuit.

12. The high-speed data path circuit of claim 8, wherein the second charging path circuit further comprises a fourth PMOS transistor connected between a second voltage source and a first resistor, wherein a first gate of the fourth PMOS transistor is connected to the enable circuit.

13. The high-speed data path circuit of claim 12, further comprising an PMOS transistor connected between the voltage output and ground with a second gate connected to a first power source through a second resistor.

14. The high-speed data path circuit of claim 8, the enable circuit includes an inverter configured to receive an enable signal and to output an inverted enable signal.

15. The high-speed data path circuit of claim 8, wherein the offset cancellation controller is configured to measure the offset of the equalizer and to produce a trim code input into the equalizer to compensate for the offset of the equalizer.

16. The high-speed data path circuit of claim 15, wherein the offset cancellation controller measures the offset of the equalizer at an output of the gain circuit.

17. The high-speed data path circuit of claim 15, wherein the offset cancellation controller measures the offset of the equalizer at an output of the transmit line driver.

18. The high-speed data path circuit of claim 15, wherein an enable signal produced by the enable circuit
    initiates operation of the offset cancellation controller, controls the level shifter to generate $V_G$, and
    controls the first switch and the second switch to connect the first equalizer input and the second equalizer input to $V_{CM}$.

\* \* \* \* \*